United States Patent [19]
Huang et al.

[11] Patent Number: 5,747,382
[45] Date of Patent: May 5, 1998

[54] TWO-STEP PLANARIZATION PROCESS USING CHEMICAL-MECHANICAL POLISHING AND REACTIVE-ION-ETCHING

[75] Inventors: Yung-Sheng Huang; Long-Sheng Yeou; Ji-Chung Huang; Chang-Song Lin, all of Hsin-chu, Taiwan

[73] Assignee: Taiwan Semiconductor Manufacturing Company, Ltd., Hsinchu, Taiwan

[21] Appl. No.: 719,232

[22] Filed: Sep. 24, 1996

[51] Int. Cl.$^6$ .................................................. H01L 21/316
[52] U.S. Cl. ........................... 438/624; 438/633; 438/699
[58] Field of Search ..................................... 437/195, 228, 437/235, 238; 156/662.1; 438/622, 624, 763, 633, 699

[56] References Cited

U.S. PATENT DOCUMENTS

| | | | |
|---|---|---|---|
| 4,775,550 | 10/1988 | Chu et al. | 427/38 |
| 5,244,541 | 9/1993 | Marks et al. | 437/228 |
| 5,302,233 | 4/1994 | Kim et al. | 156/636 |
| 5,312,512 | 5/1994 | Allman et al. | 156/636 |
| 5,395,801 | 3/1995 | Doan et al. | 437/225 |
| 5,494,854 | 2/1996 | Jain | 437/195 |
| 5,532,191 | 7/1996 | Nakano et al. | 437/228 |
| 5,639,697 | 6/1997 | Weling et al. | 438/633 |

FOREIGN PATENT DOCUMENTS 7-058104  3/1995  Japan.

OTHER PUBLICATIONS

Wolf, Stanley *Silicon Processing for the VLSI Era* vol. 2 (1990) pp. 196, 212–213, 222–224, 238–239 1990.
El-Kareth, Badih *Fundamentals of Semiconductor Processing Technology*, (1995) pp. 282, 568–570, 572 1995.

*Primary Examiner*—Charles L. Bowers, Jr.
*Assistant Examiner*—Matthew Whippel
*Attorney, Agent, or Firm*—George O. Saile; Stephen B. Ackerman

[57] ABSTRACT

A novel method is presented to form and planarize an inter-metal-dielectric(IMD) layer of an integrated circuit with two or more levels of interconnection metallurgy. The method utilizes chemical-mechanical-polishing(CMP) followed by reactive-ion-etching(RIE) to first planarize and then etch back a deposited IMD layer. Metal line spacings of less than 1.5 microns produce voids in the IMD even when spin-on-glass(SOG) is used to partially fill the spaces prior to IMD deposition. These voids, which contain organic residues and debris, can produce eruptions of material during several subsequent processing steps. The method of this invention attenuates and de-activates these voids, rendering them completely benign. Since CMP is only used to achieve a planar surface, risks of CMP damage to alignment marks and other features are also reduced.

23 Claims, 4 Drawing Sheets

TWO-STEP PLANARIZATION PROCESS USING CHEMICAL-MECHANICAL POLISHING AND REACTIVE-ION-ETCHING

BACKGROUND OF THE INVENTION

(1) Field of the Invention

The invention relates to processes for the manufacture of semiconductor devices and more particularly to processes related to the planarization of interconnection metallurgy on semiconductor wafer surfaces.

(2) Description of previous art

The fabrication of integrated circuits not only involves the forming of semiconductor devices within the surface of a semiconductor wafer but also requires the creation of a complex network of wiring interconnections which comprise the electrical circuitry of the completed chip. These interconnections are accomplished by the alternate deposition of thin layers of conductive and insulative materials over the semiconductor devices. Each conductive layer is patterned by photolithographic techniques to form the wiring design for that level. The patterning process produces, by necessity, a surface with topological features, which, if no steps were taken, would replicate itself in each succeeding layer.

Conductive layers which usually are metals such as aluminum alloys, are deposited by physical-vapor-deposition(PVD) techniques such as vacuum evaporation or sputtering. These methods do not provide conformal coverage and the presence of topological features on the underlying surface result in non-uniformities in thickness and other problems related to the shadowing effects of non-planar surfaces.

Typically two to four levels of interconnection metallurgy are required to form the necessary circuit interconnections on an integrated circuit chip. In order to provide a planar surface for each level of metal, various methods have been used to planarize the insulator surface. Glasses which flow when heated are commonly used to accommodate the first layer of metallization. Subsequent levels, where elevated temperatures are no longer permissible, employ thin layers of materials which are deposited as liquids and then cured to form solid layers. Such materials, called spin-on-glasses (SOG), provide an improved local surface planarity. Subsequent reactive-ion-etching(RIE) of these layers leaves pockets of these materials between the metal lines.

After the SOG pockets have been formed a thick inter-metal-dielectric(IMD)layer of silicon oxide or a silicate glass is deposited over the wafer the surface. The layer is made thicker than required in order to smooth out the remaining subjacent topology. Broader variations of metal densities still remain apparent at the surface of the thick layer. These broad irregularities are then removed by chemical-mechanical-polishing(CMP) which is carried out beyond the point of planarization in order to reduce the IMD to a specified thickness.

In FIG. 1 there is shown a cross section of a wafer 10 having lower levels of interconnections 12 on its surface comprising, for example, of layers of polysilicon, metal, and insulators which form the gate and contact structure of self-aligned gate MOS field effect transistors(MOSFETS). Three closely spaced second metal(in this example) lines 14 are shown with a layer of Silicon oxide 13 as a cushion for the SOG over them. The metal lines 14 are typically an Al/Cu alloy having a thin Ti/TiN barrier layer 14A at their base and a TiN antireflection-coating(ARC) layer 14B on top. The etched back SOG 16 leaves rounded dips 24 in the surface between the tightly spaced metal lines and partially fills the broader regions 26.

The IMD layer 20, is shown in its as-deposited thickness in FIG. 1. The dips 24 are smoothed out in the upper surface of the IMD layer 20 but the broader regions 26 still replicate the non-planarity 28. When the spacing of the metal lines is less than about 1.5 microns, seams or voids 22 occur in the IMD layer. These extend significantly above the plane of the metal layer 14. Such seams have been reported by Chu et.al. U.S. Pat. No. 4,775,550 in a similar context. In their treatment the seams occurred when the IMD layer is deposited directly over the metal lines. By incorporating an SOG layer over an insulating layer, then etching back to the insulating layer and depositing the final IMD layer they found that they could eliminate seams for metal spacings as small as 2 microns.

The process addressed by this invention contains line spacings of 1.5 microns and less where, unfortunately, the seam problem returns, even when SOG is used. Referring now to FIG. 2, the layer 20 is polished to a level shown. The broad dips 28 have been removed. However, the seams 22 have now been exposed by the CMP. The remaining thickness of the IMD layer after CMP is approximately 1.0 to 1.3 microns. The seams initially contain trapped organic residues formed from the by-products of the TEOS deposition reaction. After CMP additional debris from the CMP processing are lodged in these seams.

The exposure of these seams now allows them to entrain moisture and other atmospheric contaminants setting the stage for processing difficulties at several subsequent processing steps. These steps typically include TiN deposition, metal patterning RIE, and spacer RIE etch back. During these steps, which involve heat or other high energy surface perturbation such as RIE, debris in the exposed pockets 22 vaporizes and explodes causing deposited material above them to erupt above the surface.

Attempts to seal the open voids by the deposition of a thin layer of silicon oxide (about 1500 Å) have succeeded in avoiding eruptions during the TiN deposition. However, the contaminants and debris still remain and eruptions occur during the succeeding RIE steps where some degree of over-etching is required. Re-deposition of silicon oxide requires over-polishing by CMP in order to maintain a specified final thickness if a thicker re-deposited silicon oxide layer is used to absorb subsequent over-etching requirements, a greater CMP over-polish is required.

Over-polishing can produce serious damage to certain features, such as penetration of the alignment marks, wherein the composite SOG plus IMD layer thickness may be less than that over the device areas.

Allman et.al. U.S. Pat. No. 5,312,512 describe a global planarization process using SOG along with CMP but do not incur the difficulties incurred with closely spaced metal lines as encountered in this docket.

A technique described by Doan et.al. U.S. Pat. No. 5,395,801 utilizes a layer of a slower polishing material over the IMD layer. Their method enhances the selectivity of etching of the high features over the low lying regions, thereby reducing the required initial thickness of the IMD layer. However, this technique would require an extra deposition step and would not address the seam problem.

SUMMARY OF THE INVENTION

It is an object of this invention to provide a method for forming an IMD layer in which the occurrence of seam explosions is eliminated during subsequent processing. This goal is accomplished by removing only enough material by CMP to provide planarization and further reducing the IMD thickness by RIE to a point where the seams are significantly penetrated by the etchant. This not only reduces their vertical size, but also chemically etches out the contaminants and residues which cause the subsequent eruptions. The RIE etch-back reduces the IMD thickness further than the prior art process, thereby permitting a thicker re-deposited layer of silicon oxide. This greater thickness provides an additional margin of safety for the subsequent metal over-etch and the spacer etch-back.

It is another object of the process of this invention to avoid CMP damage to alignment marks by eliminating the use of CMP past the point of planarization. The use of RIE to further thin the IMD layer is not damaging to the alignment marks if they are penetrated.

Another advantage of using RIE etch-back to reduce Mn.D thickness after CMP planarization has been achieved is that the etching uniformity of RIE is significantly better than that of CMP (±5% for RIE vs ±10% for CMP). En addition the RIE etch back improves the overall wafer uniformity by compensating the CMP center-to-edge removal rates. The CMP removal rate is greater at the wafer edge than at the center while the RIE rate exhibit the opposite tendency.

DESCRIPTION OF THE PREFERRED EMBODIMENTS

Figure 1:
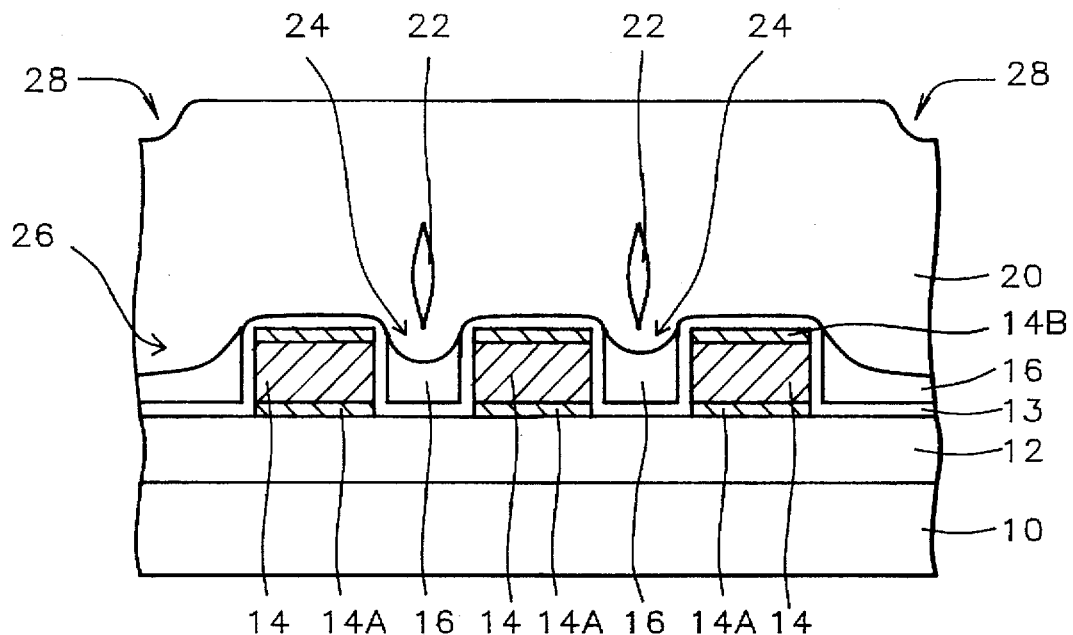
FIG. 1 and FIG. 2 are cross sections of a prior art process steps related to the field of this invention.

Accordingly, a p-type <100>oriented single-crystalline silicon wafer having semiconductor devices formed within its surface is provided. Contact to the device active areas through a first insulating layer have been provided and any polysilicon levels required by the integrated circuit design are in place. The starting point for this invention is represented by the cross sectional drawing of FIG. 1. The wafer 10 is shown and the above-wafer structures consisting of the polysilicon levels and their associated contacts and insulators are depicted by the layer 12.

A first metallization layer 14 is deposited and patterned by standard photolithography and RIE to form a network of metal conductive lines which form the connections between the circuits within the layer 12 and the next higher level of metallization. These lines are typically of an aluminum alloy and are between about 4,000 and 10,000 Angstroms thick. A 1,000 to 3,000 Angstrom thick silicon oxide layer 13 is deposited over the metal 14 to prevent the SOG 16 from directly contacting the metal layer. The SOG layer 16 and the as-deposited IMD layer 20 with seams 22 and broad depressions 28 are in place.

Figure 2:
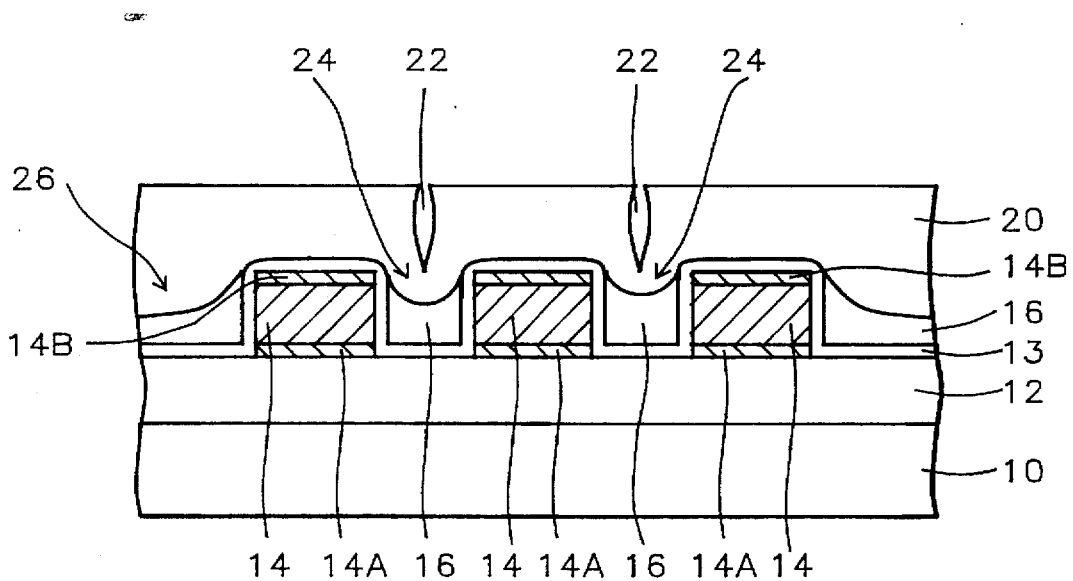
Figure 3:
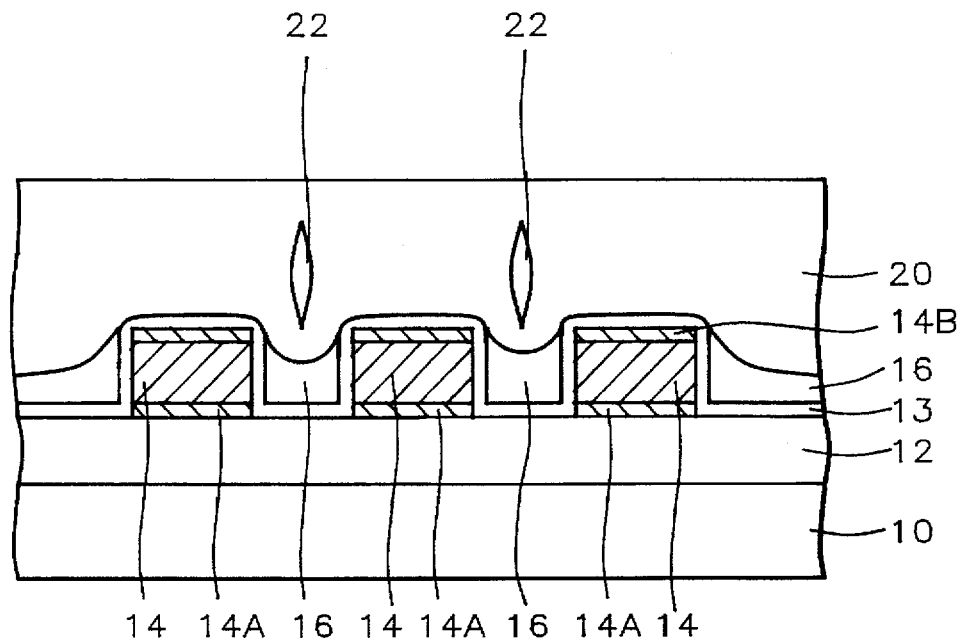
FIG. 3 through FIG. 6 are cross sections of the processing steps for the method of this invention.

Referring now to FIG. 3, the IMD layer 20 is planarized using CMP to a level such that the broad global features 28 have just been removed. Comparing this to FIG. 2, it is seen that the seams 22 have not been exposed by the CMP. Less CMP process time is required than by the previous approach and the risk introducing added contamination from the CMP process into the seams 22 is avoided. A wider tolerance of CMP endpoint is also permitted by this reduced CMP step.

Figure 4:
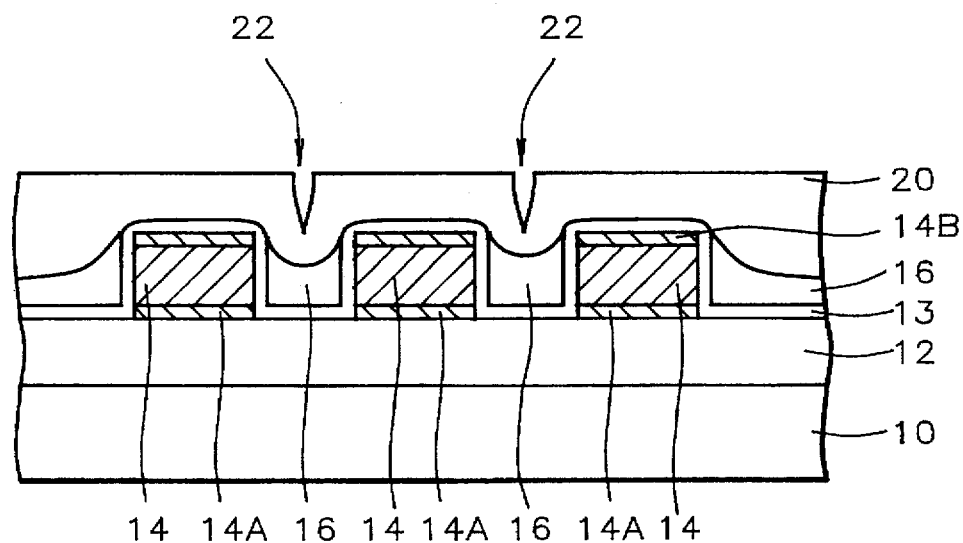

The wafer is next placed into an RIE tool and further etched using a gas mixture containing $CF_4$, $CHF_3$ and argon to a level shown in FIG. 4. the thickness of the IMD layer 20 is now less than the specified design thickness and the seams 22 have been penetrated farther than in the prior art process. The RIE etchant gases having, thorough access to the inside of the seams 22, remove all vestiges of the organic residues contained within them, thereby rendering them safe from possible eruption during subsequent processing.

The etch-back thickness is determined by the design thickness for the layer 20 minus the thickness of the next to be deposited silicon oxide layer. End point for the RIE is determined by elapsed time. After removal from the RIE tool the remaining oxide thickness is measured by optical interferometry and an amount of re-deposited silicon oxide is determined.

Figure 5:
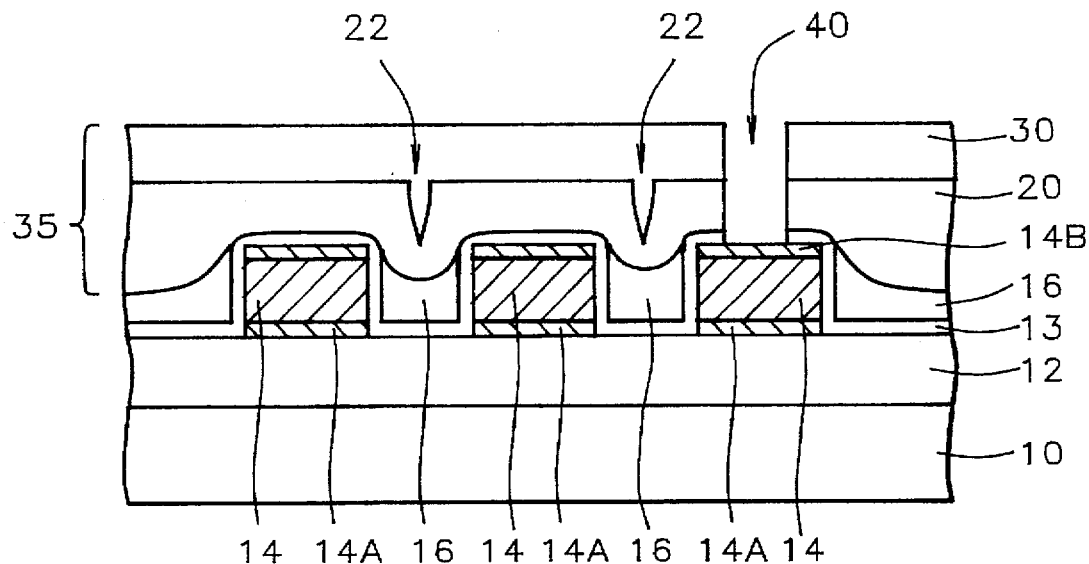

Referring now to FIG. 5 a layer of silicon oxide 30 is deposited over layer 20. This layer is between 1,000 and 3,000 Angstroms thick and is deposited by PECVD. The temperature of this deposition is between 350° C. and 450° C. Any moisture adsorbed in the seams 22 is properly baked out prior to the silicon oxide deposition because the seams are now adequately exposed. The completed IMD layer 35 now comprises silicon oxide layers 20 and 30.

Via openings 40 are next formed in the IMD layer 35 at appropriate locations to contact the metal pattern 14, During this RIE step, alignment marks are also exposed in the alignment mark areas located elsewhere on the chip. These marks must be opened during this via etch so that their topology is replicated in the subsequent metal deposition. The via openings 40 are then filled with a conductive material 42 such as LPCVD tungsten. The methods of forming tungsten contacts and vias are well known in the art and will not be discussed here.

Figure 6:
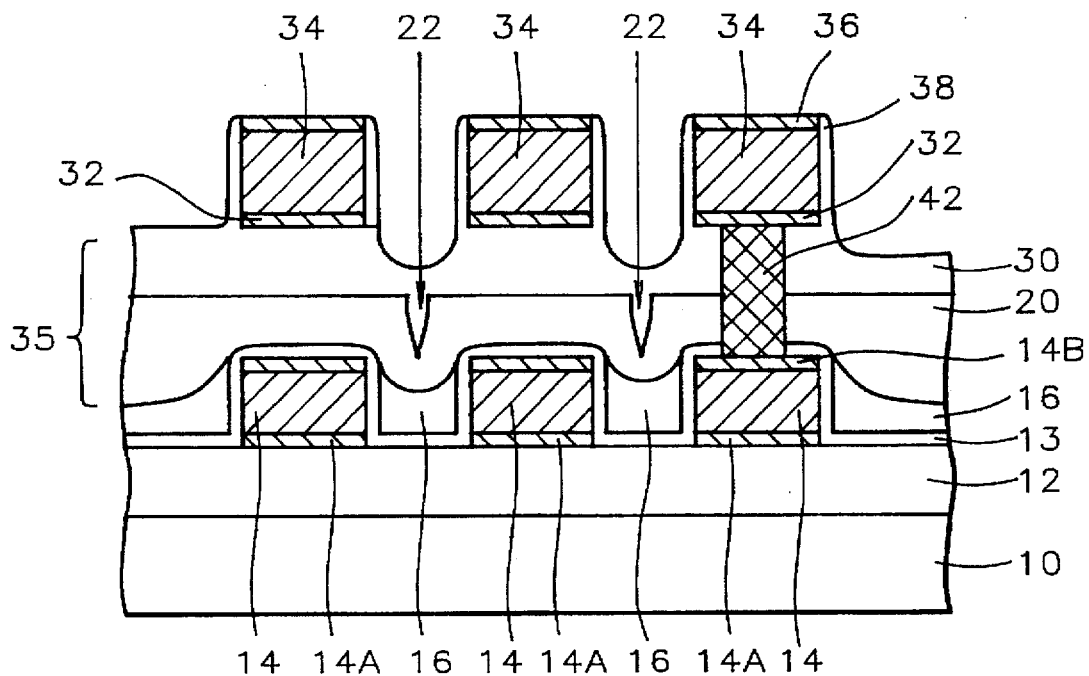

A layer of TiN 32 is next deposited by dc sputtering. The layer is between about 800 and 2,000 Angstroms thick and forms an adhesion layer between the tungsten plug 42 and the next deposited metal layer. Referring now to FIG. 6, a second layer of metal 34 is deposited. A layer of ARC 36 is deposited followed by a layer of photoresist. The next level of interconnection wiring is patterned in the photoresist and then etched in the metal layer 34 by RIE Over-etching of the metal 34 and the adhesion layer 32 is necessary in order to assure the absence of any patches of remnant metal which could cause shorting between adjacent metal lines. The silicon oxide layer 30 is of adequate thickness to absorb the over-etching.

Sidewall spacers 38 are next incorporated by first depositing a 2,500 Angstrom thick layer of silicon oxide followed by a layer of SOG and then etching back unidirectionally with RIE to expose the top surface of the metallization layer 34.

As can be seen in FIG. 6, the danger of eruptions from the seams 22 is virtually eliminated by three discrete features provided by this invention, viz.
1. The organic residue and debris have been removed from the seams 22 by the RIE etch-back.
2. The seams 22 have been reduced in vertical size as well as opened further to allow better access to filling by the silicon oxide layer 30.
3. The silicon oxide layer 30 is sufficiently thick to absorb any over-etch required by the subsequent metal and spacer etches.

Figure 7:
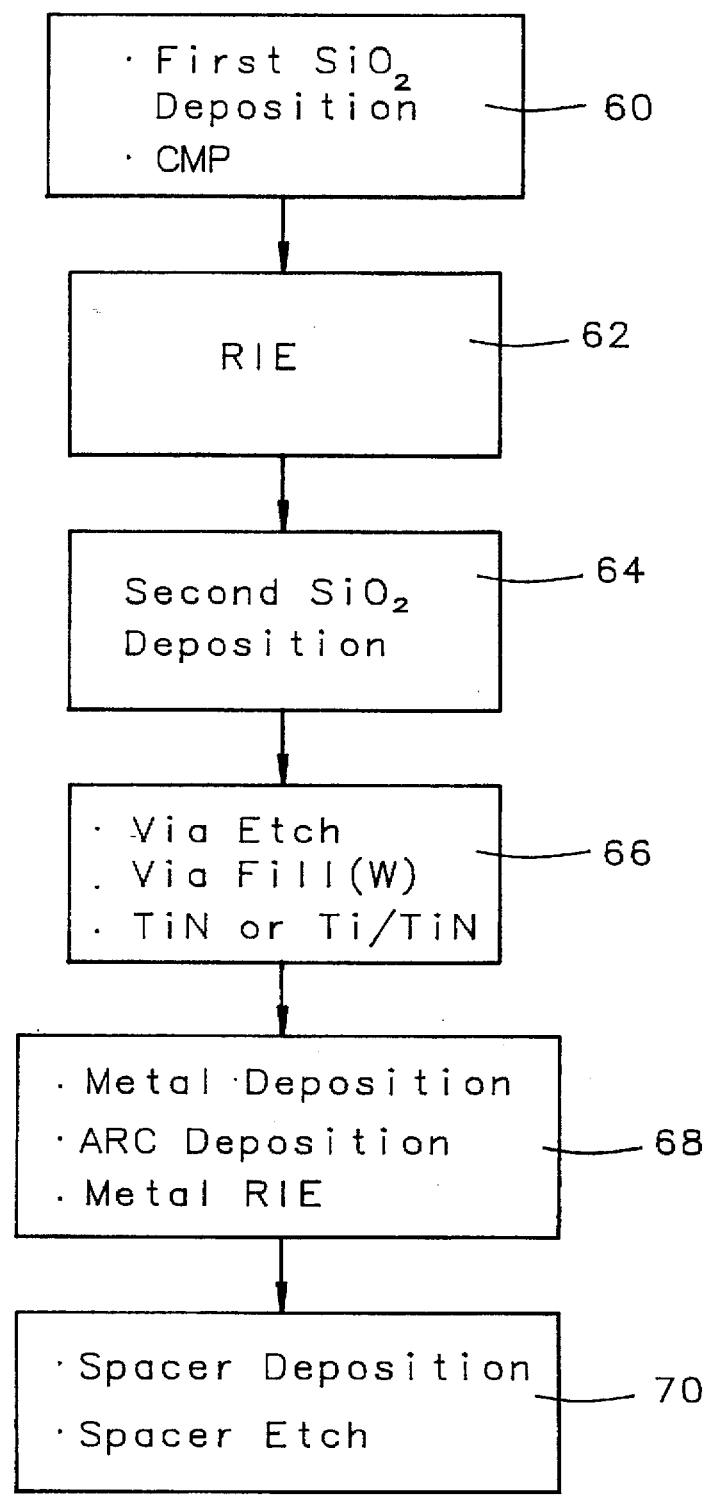
FIG. 7 is a flow chart showing the processing steps of this invention.

FIG. 7 gives a flow chart of the processing steps related to this invention. In the step 60 the CMP is conducted only to the point of planarization of the wafer surface. The RIE step 62 reduces the IMD thickness to open the seams and cleanse the residues from them. PECVD silicon oxide is then deposited 64 to the achieve the thickness required for the IMD layer. The three remaining steps 66, 68 and 70 are now free of seam explosion risk, require reduced inspection, and significantly less wafer scrapping. An improvement in long term reliability is also be realized due to the absence of corrosive contaminants within the seams.

This embodiment is not restricted to a particular interconnection level. Whereas it was described for a level involving a first and second metallization, it could just as well be applied to any successive metallization levels. Thus the steps 60 through 70 of FIG. 7 are applicable at each interconnection level.

The embodiment described uses a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method for forming a planar insulating layer over a metal pattern having line spacings of less than 1.5 microns on a silicon wafer comprising:

(a) providing a silicon wafer having a metal pattern having line spacings of less than 1.5 microns formed over its surface;

(b) forming a surface smoothing layer over said silicon wafer;

(c) depositing a first insulating layer over said silicon wafer whereby voids are formed within said first insulating layer over said line spacings of less than 1.5 microns;

(d) removing a first thickness of said first insulating layer by chemical-mechanical-polishing(CMP) whereby the surface of said first insulating layer is planarized without exposing said voids; then (e) removing a second thickness of said first insulating layer by a dry etching technique whereby said voids are exposed; and (f) depositing a second insulating layer over said silicon wafer.

2. The method of claim 1 wherein said surface smoothing layer is a spin-on-glass.

3. The method of claim 1 wherein said surface smoothing layer comprises silicon oxide sidewalls.

4. The method of claim 1 wherein said first insulating layer is between about 2.2 and 3.3 microns thick.

5. The method of claim 1 wherein said first insulating layer is silicon oxide deposited by PECVD using tetraethoxy orthosilicate at a temperature of between about 350° C. and 450° C.

6. The method of claim 1 wherein said first insulating layer is selected from the group consisting of a phosphosilicate glass and a borophosphosilicate glass.

7. The method of claim 1 wherein said CMP is performed for a time to reduce the thickness of said first insulating layer to between about 6,000 to 14,000 Angstroms.

8. The method of claim 1 wherein said dry etching technique is reactive-ion-etching(RIE).

9. The method of claim 1 wherein said second insulating layer is silicon oxide deposited by PECVD using tetraethoxy orthosilicate.

10. The method of claim 9 wherein said silicon oxide is deposited at a temperature of between about 350° C. and 450° C. and is about 1,000 to 3,000 Angstroms thick.

11. The method of claim 1 wherein said second insulating layer is selected from the group consisting of a phosphosilicate glass and a borophosphosilicate glass.

12. A method for forming an integrated circuit having metal line spacings of less than 1.5 microns and planarized insulating layers comprising:

(a) providing a silicon wafer having integrated circuit devices formed within its surface, a level of polysilicon based device components and local polysilicon circuitry formed over its surface and an arrangement of contacts or vias imbedded in a dielectric layer over said local polysilicon circuitry;

(b) depositing a conductive layer over said silicon wafer;

(c) patterning and etching said conductive layer to define a level of interconnection circuitry having line spacings of less than 1.5 microns;

(d) forming a surface smoothing layer over said conductive layer;

(e) depositing a first insulating layer over said silicon wafer whereby voids are formed within said first insulating layer over said line spacings of less than 1.5 microns;

(f) removing a first thickness of said first insulating layer by chemical-mechanical-polishing(CMP) whereby the surface of said first insulating layer is planarized without exposing said voids; then (g) removing a second thickness of said first insulating layer by a dry etching technique whereby said voids are exposed;

(h) depositing a second insulating layer over said silicon wafer;

(I) patterning and etching an arrangement of via openings in said first and second insulating layers thereby exposing portions of said conductive layer;

(j) filling said via openings with a conductive material;

(k) repeating steps (b) through (i) for each additional level of interconnecting metallurgy required by of said integrated circuit; and (l) depositing, patterning, and etching a final conductive layer for accessing external terminations of said integrated circuit.

13. The method of claim 12 wherein said conductive layer is selected from the group consisting of a metal layer, a metal layer with a subjacent titanium nitride layer, and a metal layer with subjacent and superjacent titanium nitride layers.

14. The method of claim 12 wherein said surface smoothing layer is a spin-on-glass.

15. The method of claim 12 wherein said surface smoothing layer comprises silicon oxide sidewalls.

16. The method of claim 12 wherein said first insulating layer is between about 2.2 and 3.3 microns thick.

17. The method of claim 12 wherein said first insulating layer is silicon oxide deposited by PECVD using tetraethoxy orthosilicate at a temperature of between about 350° C. and 450° C.

18. The method of claim 12 wherein said first insulating layer is selected from the group consisting of a phosphosilicate glass, and a borophosphosilicate glass.

19. The method of claim 12 wherein said CMP is performed for a time to reduce the thickness of said first insulating layer to between about 6,000 to 14,000 Angstroms.

20. The method of claim 12 wherein said dry etching technique is reactive-ion-etching(RIE) utilizing a gas containing tetrafluoromethane.

21. The method of claim 12 wherein said second insulating layer is silicon oxide deposited by PECVD using tetraethoxy orthosilicate.

22. The method of claim 21 wherein said silicon oxide is deposited at a temperature of between about 350° C. and 450° C. and is about 1,000 to 3,000 Angstroms thick.

23. The method of claim 14 wherein said second insulating layer is selected from the group consisting of a phosphosilicate glass and a borophosphosilicate glass.

* * * * *